United States Patent
Ohashi et al.

(10) Patent No.: US 9,953,944 B2
(45) Date of Patent: Apr. 24, 2018

(54) POWER MODULE

(71) Applicant: MITSUBISHI MATERIALS CORPORATION, Tokyo (JP)

(72) Inventors: Toyo Ohashi, Kitamoto (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/777,620

(22) PCT Filed: Mar. 25, 2014

(86) PCT No.: PCT/JP2014/058238
§ 371 (c)(1),
(2) Date: Sep. 16, 2015

(87) PCT Pub. No.: WO2014/157178
PCT Pub. Date: Oct. 2, 2014

(65) Prior Publication Data
US 2016/0276302 A1    Sep. 22, 2016

(30) Foreign Application Priority Data
Mar. 29, 2013  (JP) ................... 2013-070823

(51) Int. Cl.
*H01L 23/00* (2006.01)
*B23K 35/26* (2006.01)
(Continued)

(52) U.S. Cl.
CPC .......... *H01L 24/29* (2013.01); *B23K 35/0222* (2013.01); *B23K 35/0238* (2013.01);
(Continued)

(58) Field of Classification Search
CPC ........ H01L 24/29; B23K 35/262; C22C 13/00
See application file for complete search history.

(56) References Cited

U.S. PATENT DOCUMENTS 9,287,187 B2 *  3/2016 Yanagawa
2002/0050510 A1 *  5/2002 Osanai ................. C04B 37/026
228/245
(Continued)

FOREIGN PATENT DOCUMENTS

JP    2002-076551 A    3/2002
JP    2003-133474 A    5/2003
(Continued)

OTHER PUBLICATIONS

Machine translation of JP-2006-66715, which is part of Applicant's IDS.*
(Continued)

*Primary Examiner* — Caleb Henry
*Assistant Examiner* — Alexander Belousov
(74) *Attorney, Agent, or Firm* — Locke Lord LLP; James E. Armstrong, IV; Nicholas J. DiCeglie, Jr.

(57) ABSTRACT

A power module is disclosed, including a power module substrate in which a circuit layer is arranged on one surface of an insulating layer; and a semiconductor element that is bonded onto the circuit layer, in which a copper layer composed of copper or a copper alloy is provided on a surface of the circuit layer to be bonded to the semiconductor element, a solder layer formed by using a solder material between the circuit layer and the semiconductor element is provided, an alloy layer containing Sn as a main component, 0.5% by mass or more and 10% by mass or less of Ni, and 30% by mass or more and 40% by mass or less of Cu at an interface of the solder layer with the circuit layer is formed, and the coverage of the alloy layer at the interface is 85% or more.

17 Claims, 9 Drawing Sheets

(51) Int. Cl.

| | | |
|---|---|---|
| *C22C 13/00* | (2006.01) | |
| *H01L 23/373* | (2006.01) | |
| *H01L 23/473* | (2006.01) | |
| *H01L 23/488* | (2006.01) | |
| *B23K 35/28* | (2006.01) | |
| *B23K 35/02* | (2006.01) | |

(52) U.S. Cl.
CPC ............ *B23K 35/26* (2013.01); *B23K 35/262* (2013.01); *B23K 35/28* (2013.01); *B23K 35/286* (2013.01); *C22C 13/00* (2013.01); *H01L 23/3735* (2013.01); *H01L 23/473* (2013.01); *H01L 23/488* (2013.01); *H01L 2224/29082* (2013.01); *H01L 2224/29111* (2013.01); *H01L 2224/29147* (2013.01); *H01L 2224/32225* (2013.01); *H01L 2924/13055* (2013.01); *H01L 2924/3512* (2013.01)

(56) References Cited

U.S. PATENT DOCUMENTS

| | | | |
|---|---|---|---|
| 2002/0190377 A1 | 12/2002 | Igarashi et al. | |
| 2004/0012097 A1 | 1/2004 | Chang et al. | |

FOREIGN PATENT DOCUMENTS

| | | | |
|---|---|---|---|
| JP | 2004-172378 A | 6/2004 | |
| JP | 2006-066716 A | 3/2006 | |
| JP | 2008-227336 A | 9/2008 | |
| JP | 2010-087072 A | 4/2010 | |
| JP | 2011-044624 A | 3/2011 | |
| WO | 2009/051255 A1 | 4/2009 | |

OTHER PUBLICATIONS

K. Nogita et al., "Inhibition of Cracking in $Cu_6Sn_5$ Intermetallic Compounds at Sn-Cu Lead-Free Solders and Cu Substrate Interfaces," International Conference on Electronics Packaging (ICEP) 2009, Apr. 16, 2009, pp. 1-6, [retrieval date May 22, 2014 (May 22, 2014)], Internet <URL:<http://www.nihonsuperior.co.jp/tech/>>.

International Search Report dated Jun. 3, 2014, issued for PCT/JP2014/058238 and English translation thereof.

Office Action (Part of Search Report) issued in corresponding Chinese Patent Application No. CN201480009406.4, dated May 3, 2017.

Office Action dated Jun. 13, 2017, issued for the Japanese patent application No. 2014-061775 and English translation thereof.

Extended European Search Report issued in corresponding European Patent Application No. EP 14773726.6, dated Oct. 27, 2016.

H. Nishikawa et al., "Interfacial Reaction between Sn-0.7Cu (-Ni) Solder and Cu Substrate," Journal of Electronic Materials, vol. 35, No. 5, pp. 1127-1132,(2006).

P. Harcuba et al., "Microstructure Changes and Physical Properties of the Intermetallic Compounds Formed at the Interface Between Sn-Cu Solders and a Cu Substrate Due to a Minor Addition of Ni," Journal of Electronic Materials, vol. 39, No. 12, pp. 2553-2557, (2010).

K. Nogita et al.,"Inhibiting Cracking of Interfacial $Cu_6Sn_5$ by Ni Additions to Sn-based Lead-free Solders," Transactions of the Japan Institute of Electronics Packaging, vol. 2, No. 1, pp. 46-54, (2009).

Notice of Reasons for Rejection (Office Action) issued in corresponding Japanese Patent Application No. JP 2014-061775, dated Oct. 17, 2017.

* cited by examiner

FIG. 10
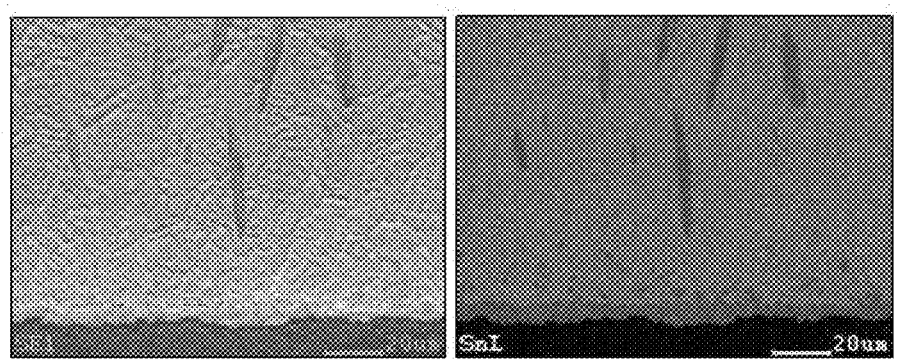
Sn
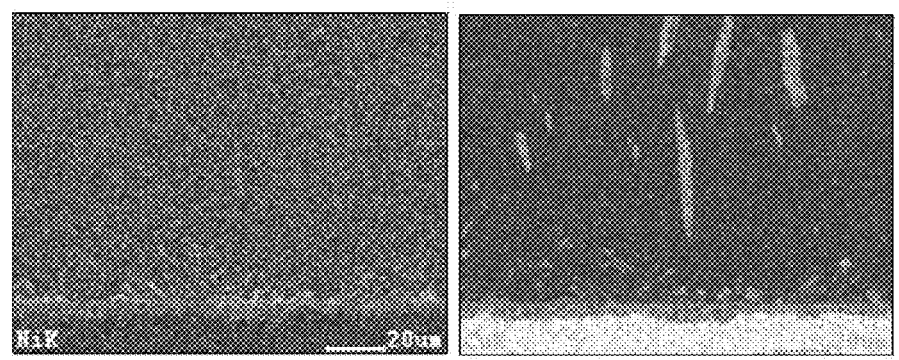
Ni            Cu

POWER MODULE

TECHNICAL FIELD

The present invention relates to a power module obtained by bonding a semiconductor element to a circular layer provided with a copper layer made of copper or a copper alloy using a solder material.

Priority is claimed on Japanese Patent Application No. 2013-070823, filed Mar. 29, 2013, the content of which is incorporated herein by reference.

BACKGROUND ART

For example, as disclosed in PTLs 1 and 2, the aforementioned power module includes a power module substrate obtained by bonding a metal plate serving as a circuit layer to one surface of an insulating substrate, and a power element (semiconductor element) mounted on the circuit layer.

In addition, a heat sink such as a radiator plate or a cooler is arranged on the other surface of the power module substrate to radiate heat from the power element (semiconductor element) in some cases. In order to alleviate thermal stress caused by thermal expansion coefficients of the insulating substrate and the heat sink such as a radiator plate or a cooler, the power module substrate is configured such that a metal plate serving as a metal layer is bonded to the other surface of the insulating substrate and the metal layer and the aforementioned heat sink such as a radiator plate or a cooler are bonded to each other.

In the aforementioned power module, the circuit layer and the power element (semiconductor element) are bonded to each other with the solder material interposed therebetween.

Here, when the circuit layer is composed of aluminum or an aluminum alloy, for example, as disclosed in PTL 3, it is necessary to form a Ni plating film on the surface of the circuit layer by electroplating or the like and to arrange the solder material on the Ni plating film to bond the semiconductor element to the circuit layer.

In addition, when the circuit layer is composed of copper or a copper alloy, a Ni plating film is formed on the surface of the circuit layer and the solder material is arranged on the Ni plating film to bond the semiconductor element to the circuit layer.

CITATION LIST

Patent Literature

[PTL 1] Japanese Unexamined Patent Application, First Publication No. 2002-076551
[PTL 2] Japanese Unexamined Patent Application, First Publication No. 2008-227336
[PTL 3] Japanese Unexamined Patent Application, First Publication No. 2004-172378

SUMMARY OF INVENTION

Technical Problem

However, when a power cycle is loaded on the power module in which the semiconductor element is bonded to the circuit layer by soldering by forming the Ni plating film on the surface of the circuit layer composed of aluminum or an aluminum alloy disclosed in PTL 3, cracks develop in the solder and the thermal resistance is likely to increase.

In addition, when a power cycle is loaded on the power module in which the semiconductor element is bonded on the surface of the circuit layer composed of copper or a copper alloy by soldering, cracks develop in the solder and the thermal resistance is likely to increase.

In recent years, a power element for controlling higher amounts of power to control wind power generation or electric vehicles such as electric automobiles has been mounted on the aforementioned power module or the like. Thus, it is necessary to further improve reliability with respect to the power cycle.

The present invention has been made in consideration of the above-described circumstances and an object thereof is to provide a power module capable of suppressing the development of cracks in a solder layer even when a power cycle is loaded and having high reliability.

Solution to Problem

As a result of extensive investigation conducted by the present inventors, it has been confirmed that in the case in which a power cycle is loaded on a power module obtained by soldering a semiconductor element to the surface of a circuit layer composed of copper or a copper alloy, if cracks are generated at the interface between the circuit layer and a solder layer, the cracks are propagated into the solder layer and the solder layer is fractured at an early stage. In addition, it has been found that the aforementioned crack development is suppressed in a region in which an alloy layer including Ni and Cu is formed at the interface between the solder layer and the circuit layer.

The present invention is made based on the aforementioned knowledge. A power module according to the present invention includes a power module substrate in which a circuit layer is arranged on one surface of an insulating layer; and a semiconductor element that is bonded onto the circuit layer, in which a copper layer composed of copper or a copper alloy is provided on a surface of the circuit layer to be bonded to the semiconductor element, a solder layer formed by using a solder material between the circuit layer and the semiconductor element is provided, an alloy layer containing Sn as a main component, 0.5% by mass or more and 10% by mass or less of Ni, and 30% by mass or more and 40% by mass or less of Cu at an interface of the solder layer with the circuit layer is formed, and the coverage of the alloy layer at the interface is 85% or more.

According to the power module having the above configuration, since the alloy layer containing Sn as a main component, 0.5% by mass or more and 10% by mass or less of Ni, and 30% by mass or more and 40% by mass or less of Cu is formed at the interface of the solder layer with the circuit layer (copper layer), which is formed between the circuit layer provided with a copper layer on the surface to be bonded to the semiconductor element and the semiconductor element, and the coverage of the alloy layer at the interface is 85% or more, it is possible to obtain a power module capable of suppressing crack development at the interface between the circuit layer (copper layer) and solder layer and having high reliability. That is, since 85% or more of the interface between the solder layer and the circuit layer (copper layer) is covered by the alloy layer, it is possible to sufficiently suppress crack development which causes breakage of the solder layer. In order to reliably exhibit the aforementioned effect, the coverage of the alloy layer at the interface is preferably set to 90% or more and most preferably set to 100%.

Here, when the Ni content in the alloy layer is less than 0.5% by mass, the alloy layer becomes thermally unstable and there is a concern that the alloy layer may function as a starting point of breakage of the solder layer. On the other hand, when the Ni content is more than 10% by mass, a thermally unstable intermetallic compound such as $Ni_3Sn_4$ or the like is formed and there is a concern that the alloy layer may function as a starting point of breakage of the solder layer.

Further, when the Cu content in the alloy layer is less than 30% by mass, the alloy layer is not sufficiently formed and becomes thermally unstable. Thus, there is a concern that the alloy layer may function as a starting point of breakage of the solder layer. On the other hand, when the Cu content in the alloy layer is more than 40% by mass, there is a concern that the alloy layer itself may function as a starting point of breakage of the solder layer.

For the above reasons, the Ni content in the alloy layer is defined to be 0.5% by mass or more and 10% by mass or less and the Cu content is defined to be 30% by mass or more and 40% by mass or less.

In addition, in the power module of the embodiment, it is preferable that a thermal resistance increase rate when a power cycle is loaded 100,000 times under conditions of a conduction duration of 5 seconds and a temperature difference of 80° C. be less than 10% in a power cycle test.

In this case, even when a power cycle is loaded repeatedly, the solder layer is not broke at the early stage and the reliability with respect to the power cycle can be improved. Since a condition in which the maximum load is applied to the solder layer is set in the aforementioned power cycle test, as long as the thermal resistance increase rate when the power cycle is loaded 100,000 times under the condition is less than 10%, sufficient reliability can be obtained in normal use.

In addition, it is preferable that a thickness of the alloy layer be within a range of 2 μm or more and 20 μm or less.

In this case, since the thickness of the alloy layer in a portion to be covered is set to 2 μm or more, the interface between the solder layer and the circuit layer (copper layer) is sufficiently strengthened and crack development at the interface can be reliably suppressed. On the other hand, since the thickness of the alloy layer is set to 20 μm or less, the occurrence of cracking in the alloy layer can be suppressed. Thus, it is possible to obtain a power module capable of suppressing breakage of the solder layer in the early stage even when a power cycle is loaded and having high reliability.

In addition, it is preferable that the alloy layer include an intermetallic compound composed of $(Cu, Ni)_6Sn_5$.

In this case, since the alloy layer includes an intermetallic compound composed of $(Cu, Ni)_6Sn_5$, the interface between the solder layer and the circuit layer (copper layer) can be sufficiently strengthened and crack development at the interface can be reliably suppressed. Thus, it is possible to reliably suppress breakage of the solder layer when a power cycle is loaded.

Advantageous Effects of Invention

According to the present invention, it is possible to provide a power module capable of suppressing breakage of a solder layer at an early stage even when a power cycle is loaded, and having high reliability.

BRIEF DESCRIPTION OF DRAWINGS

FIG. 10 shows a SEM observation result and an EPMA element mapping result of a solder layer of a power module.

DESCRIPTION OF EMBODIMENTS

Hereinafter, a power module as an embodiment of the present invention will be described with reference to the attached drawings.

First Embodiment

Figure 1:
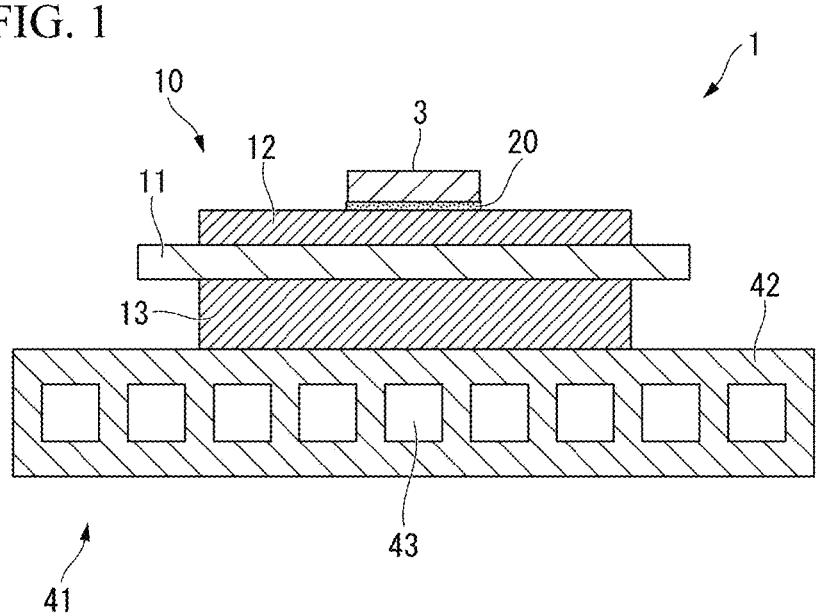
FIG. 1 is a schematic explanatory diagram of a power module as a first embodiment of the present invention.

In FIG. 1, a power module 1 as a first embodiment of the present invention is shown. The power module 1 includes a power module substrate 10 in which a circuit layer 12 is arranged on one surface of an insulating substrate (insulating layer) 11, and a semiconductor element 3 that is mounted on the circuit layer 12 (the upper surface in FIG. 1). In the power module 1 of the embodiment, a heat sink 41 is bonded to the other surface of the insulating substrate 11 (the lower surface in FIG. 1).

The power module substrate 10 includes the insulating substrate 11 that forms the insulating layer, the circuit layer 12 that is arranged on one surface of the insulating substrate 11 (the upper surface in FIG. 1), and a metal layer 13 that is arranged on the other surface of the insulating substrate 11 (the lower surface in FIG. 1).

The insulating substrate 11 prevents electrical connection between the circuit layer 12 and the metal layer 13 and is composed of ceramics having a high degree of insulation such as MN (aluminum nitride), $Si_3N_4$ (silicon nitride), or $Al_2O_3$ (alumina), and in the embodiment, the insulating substrate 11 is composed of AlN (aluminum nitride). In addition, the thickness of the insulating substrate 11 is set to be within a range of 0.2 mm or more and 1.5 mm or less and is set to 0.635 mm in the embodiment.

The circuit layer 12 is formed by bonding a conductive metal plate to one surface of the insulating substrate 11. In the embodiment, the circuit layer 12 is formed by bonding a copper sheet composed of a rolled plate of oxygen-free copper to the insulating substrate 11.

In the embodiment, the entire circuit layer 12 corresponds to a copper layer composed of copper or a copper alloy provided on the surface to be bonded to the semiconductor element 3. The thickness of the circuit layer 12 (the thickness of the copper sheet) is preferably set to be within a range of 0.1 mm or more and 1.0 mm or less.

The metal layer 13 is formed by bonding a metal plate onto the other surface of the insulating substrate 11. In the embodiment, the metal layer 13 is formed by bonding an aluminum sheet composed of a rolled plate of aluminum (so-called 4N aluminum) having a purity of 99.99% by mass or more to the insulating substrate 11. The thickness of the metal layer 13 (aluminum sheet) is preferably set to be within a range of 0.6 mm or more and 3.0 mm or less.

The heat sink 41 is used for cooling the aforementioned power module substrate 10 and includes a top plate portion 42 to be bonded to the power module substrate 10, and a flow passage 43 in which a cooling medium (for example, cooling water) flows. The heat sink 41 (top plate portion 42) is desirably composed of a material having excellent thermal conductivity and is composed of aluminum material of A6063 (aluminum alloy) in the embodiment.

Figure 2:
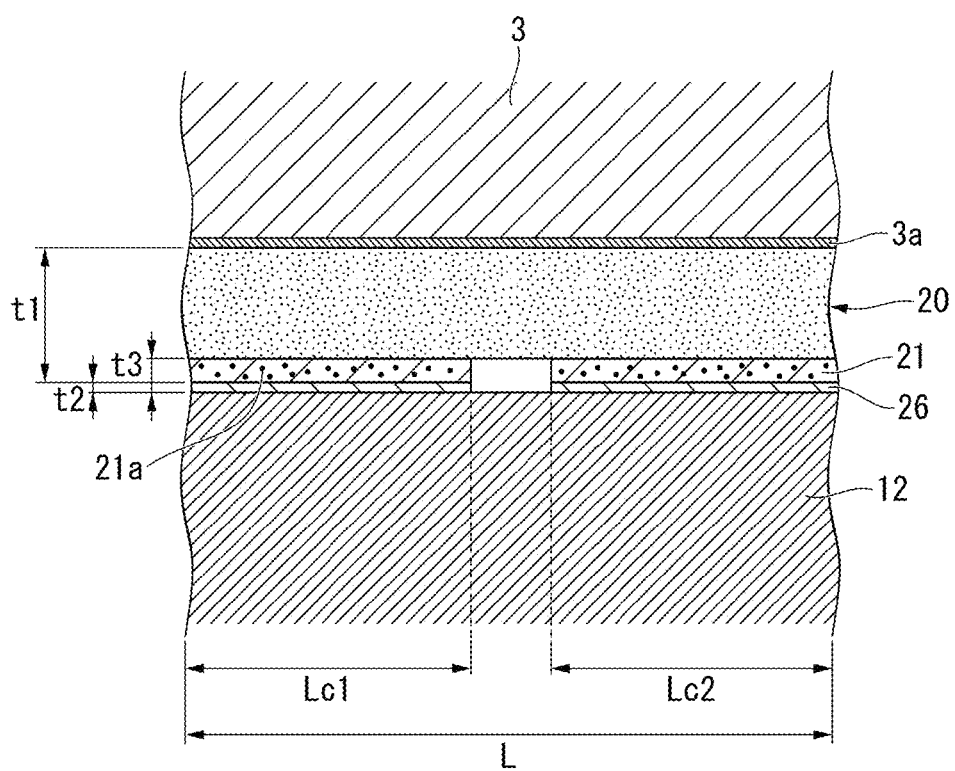
FIG. 2 is an enlarged explanatory diagram of a portion in which a circuit layer and a semiconductor element are bonded to each other in FIG. 1.

The semiconductor element 3 is composed of a semiconductor material such as Si and as shown in FIG. 2, a surface treatment film 3a composed of Ni, Au, and the like is formed on the surface to be bonded to the circuit layer 12.

In the power module 1 of the embodiment, the circuit layer 12 and the semiconductor element 3 are bonded to each other by soldering and a solder layer 20 is formed between the circuit layer 12 and the semiconductor element 3. In the embodiment, the thickness t1 of the solder layer 20 is set to be within a range of 50 μm or more and 200 μm or less.

Figure 4:
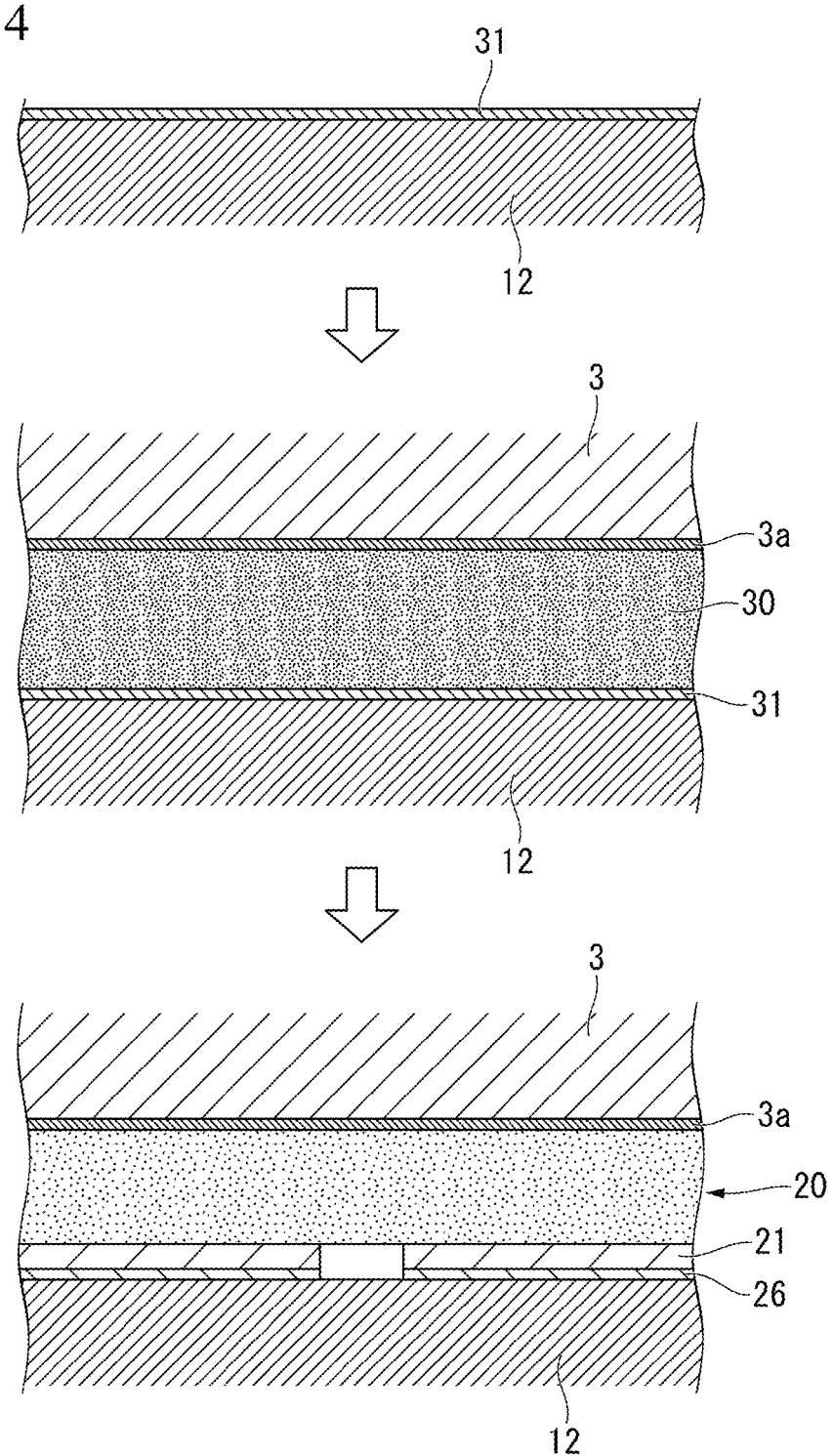
FIG. 4 is an explanatory diagram of a semiconductor element-bonding process in the method of producing the power module shown in FIG. 3.

As shown in FIG. 4, the solder layer 20 is formed by using a Sn—Cu—Ni-based solder material 30 and in the embodiment, a solder material 30 composed of Sn-0.1% by mass to 4% by mass Cu-0.01% by mass to 1% by mass Ni is used.

Here, as shown in FIG. 2, an intermetallic compound layer 26 is formed on the surface of the circuit layer 12 and the solder layer 20 is arranged on the intermetallic compound layer 26 in a laminated manner. The intermetallic compound layer 26 is composed of an intermetallic compound of Cu and Sn ($Cu_3Sn$). In addition, the thickness t2 of the intermetallic compound layer 26 is set to 0.8 μm or less.

An alloy layer 21 which has a composition containing Sn as a main component, 0.5% by mass or more and 10% by mass or less of Ni, and 30% by mass or more and 40% by mass or less of Cu is formed at the interface between the solder layer 20 and the circuit layer 12, and the thickness t3 of the alloy layer 21 is set to be within a range of 2 μm or more and 20 μm or less.

In the embodiment, the alloy layer 21 includes an intermetallic compound 21a composed of $(Cu, Ni)_6Sn_5$.

In the power module 1 of the embodiment, the coverage of the alloy layer 21 at the interface between the solder layer 20 and the circuit layer 12 is set to 85% or more. In the embodiment, as shown in FIG. 2, the intermetallic compound layer 26 is also not formed in a region in which the alloy layer 21 is not formed.

Here, as shown in FIG. 2, the coverage of the alloy layer 21 at the interface is a ratio $L_C/L$ of the length $L_C$ of the interface covered by the alloy layer 21 to the length of the entire interface that is observed when the section of the circuit layer 12 and the solder layer 20 is observed ($=L_{C1}+L_{C2}$).

In addition, in the power module 1 of the embodiment, the thermal resistance increase rate when a power cycle is loaded 100,000 times under conditions of a conduction duration of 5 seconds and a temperature difference of 80° C. is less than 10% in a power cycle test.

Specifically, as the semiconductor element 3, an IGBT element is soldered to the circuit layer 12 and a connection wire composed of an aluminum alloy is bonded to the circuit layer 12. Then, electric conduction to the IGBT element is controlled to repeat a cycle in which the temperature of the element surface when the current is applied (ON) reaches 140° C. and the temperature of the element surface when the current is not applied (OFF) reaches 60° C. at an interval of 10 seconds, and the thermal resistance increase rate after the power cycle is repeated 100,000 times is less than 10%.

Figure 3:
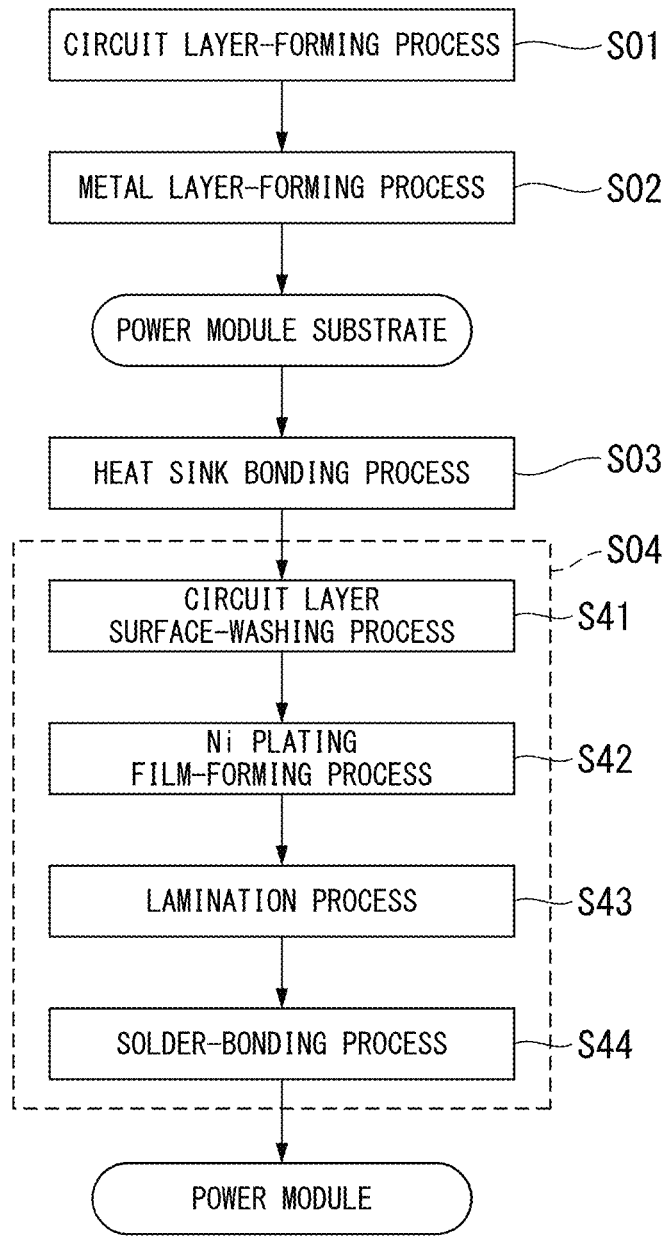
FIG. 3 is a flow diagram showing a method of producing the power module in FIG. 1.

Hereinafter, a method of producing the power module of the embodiment will be described with reference to the flow diagram in FIGS. 3 and 4.

First, a copper sheet serving as the circuit layer 12 and the insulating substrate 11 are bonded to each other (circuit layer-forming process S01). The insulating substrate 11 and the copper sheet serving as the circuit layer 12 are bonded by a so-called active metal brazing method. In the embodiment, an active brazing material composed of Ag-27.4% by mass Cu-2.0% by mass Ti is used.

The copper sheet serving as the circuit layer 12 is laminated on one surface of the insulating substrate 11 with the active brazing material interposed therebetween and the insulating substrate 11 and the copper sheet are placed into a heating furnace and are heated therein in a state in which the copper sheet and the insulating substrate are compressed in the lamination direction at, for example, a pressure of 1 $kgf/cm^2$ to 35 $kgf/cm^2$ ($9.8 \times 10^4$ Pa or more and $343 \times 10^4$ Pa or less) to bond the copper sheet serving as the circuit layer 12 and the insulating substrate 11. The heating temperature is set to 850° C. and the heating time is set to, for example, 10 minutes.

Next, an aluminum sheet serving as the metal layer 13 is bonded on the other surface of the insulating substrate 11 (metal layer-forming process S02). The aluminum sheet is laminated on the insulating substrate 11 with a brazing material interposed therebetween and the insulating substrate 11 and the aluminum sheet are bonded by brazing. As the brazing material, for example, an Al—Si-based brazing material foil having a thickness of 20 μM to 110 μm can be used and the brazing temperature is preferably set to, for example, 600° C. to 620° C.

Accordingly, the power module substrate 10 can be produced.

Next, the heat sink 41 is bonded to the other surface of the metal layer 13 (heat sink bonding process S03). The metal layer 13 is laminated on the top plate portion 42 of the heat sink 41 with a brazing material interposed therebetween and the metal layer 13 and the heat sink 41 are bonded by brazing.

As the brazing material, for example, an Al—Si-based brazing material foil having a thickness of 20 μm to 110 μm can be used and the brazing temperature is preferably set to, for example, 590° C. to 610° C.

Then, the semiconductor element 3 is bonded onto the circuit layer 12 (semiconductor element-bonding process S04). As shown in FIG. 3, the semiconductor element-bonding process S04 has a circuit layer surface-washing process S41, a Ni plating film-forming process S42, a lamination process S43, and a solder-bonding process S44.

In the circuit layer surface-washing process S41, first, the surface of the circuit layer 12 was washed with alkali. As a washing solution used in the alkaline washing, for example, a 5% by mass aqueous solution of sodium hydroxide and the like can be used. Then, the surface was rinsed with pure water and then washed with acid. As a washing solution used in the acid washing, a liquid mixture of hydrogen peroxide solution and sulfuric acid and the like can be used. Thereafter, the surface is rinsed with pure water.

Next, as shown in FIG. 4, a thin Ni plating film 31 having a thickness of about 0.2 μm is formed on the surface of the circuit layer 12 (Ni plating film-forming process S42).

Then, the semiconductor element 3 is laminated on the Ni plating film 31 with the solder material 30 composed of Sn-0.1% by mass to 4% by mass Cu-0.01% by mass to 1% by mass Ni interposed therebetween (lamination process S43).

In a state in which the semiconductor element 3 is laminated on the Ni plating film 31, the laminated body is placed into a reducing furnace, whereby the circuit layer 12 and the semiconductor element 3 are bonded to each other (solder-bonding process S44). The atmosphere in the reducing furnace is set to a reducing atmosphere containing, for example, 1% by volume to 10% by volume of hydrogen, the heating temperature is set to, for example, 280° C. to 330° C., and the holding time is set to, for example, 0.5 minutes to 2 minutes. In addition, the average cooling rate to room temperature is set to be within a range of, for example, 2° C./s to 3° C./s.

Accordingly, the power module 1 of the embodiment is produced by forming the solder layer 20 between the circuit layer 12 and the semiconductor element 3.

Ni in the Ni plating film 31 that is formed on the surface of the circuit layer 12 diffuses into the solder material 30 and thus the Ni plating film 31 disappears.

In addition, Cu of the circuit layer 12 diffuses into the solder material 30 to form the alloy layer 21 at the interface of the solder layer 20 with the circuit layer 12. Further, the alloy layer 21 has a composition containing Sn as a main component, 0.5% by mass or more and 10% by mass or less of Ni, and 30% by mass or more and 40% by mass or less of Cu.

The coverage of the alloy layer 21 at the interface between the circuit layer 12 and the solder layer 20 is 85% or more.

In the power module 1 having the above-described configuration of the embodiment, the alloy layer 21 having a composition containing Sn as a main component, 0.5% by mass or more and 10% by mass or less of Ni, and 30% by mass or more and 40% by mass or less of Cu is formed at the interface of the solder layer 20 with the circuit layer 12, and coverage of the alloy layer 21 at the interface is set to 85% or more. Thus, it is possible to obtain a power module 1 capable of suppressing crack development at the interface between the circuit layer 12 and the solder layer 20 and having high reliability.

In addition, since the alloy layer 21 contains Ni within a range of 0.5% by mass or more and 10% by mass or less, the alloy layer 21 is composed of a thermally stable intermetallic compound and thereby it is possible to reliably suppress breakage of the solder layer 20.

Further, since the alloy layer 21 contains Cu within a range of 30% by mass or more and 40% by mass or less, the coverage of the alloy layer 21 at the interface can be set to 85% or more and the alloy layer 21 itself can be prevented from functioning as a starting point of breakage.

In the power module 1 of the embodiment, when a power cycle test is conducted under conditions of a conduction duration of 5 seconds and a temperature difference of 80° C., the number of cycles until the thermal resistance increase rate is more than 10% is 100,000 or more. Thus, it is possible to improve reliability without breaking of the solder layer 20 when the power cycle is loaded.

Further, in the power module 1 of the embodiment, since the thickness of the alloy layer 21 at the portion to be covered is set to be within a range of 2 μm or more and 20 μm or less, the interface between the solder layer 20 and the circuit layer 12 is sufficiently strengthened. Thus, crack development at the interface can be reliably suppressed and the occurrence of cracking inside the alloy layer 21 can be suppressed. Accordingly, it is possible to obtain a power module 1 capable of reliably suppressing breakage of the solder layer 20 and having excellent reliability.

Further, in the power module 1 of the embodiment, since the alloy layer 21 includes the intermetallic compound $21a$ composed of $(Cu, Ni)_6Sn_5$ and the intermetallic compound layer 26 composed of $Cu_3Sn$ is formed between the alloy layer 21 and the circuit layer 12, the interface between the solder layer 20 and the circuit layer 12 can be sufficiently strengthened. Accordingly, crack development at the interface can be reliably suppressed and breakage of the solder layer 20 when a power cycle is loaded can be reliably suppressed.

Furthermore, in the embodiment, since the thin Ni plating film 31 having a thickness of 0.2 μm or less is formed on the surface of the circuit layer 12, the Ni plating film 31 does not remain during the solder-bonding of the semiconductor element 3, and diffusion of Cu of the circuit layer 12 into the solder material 30 is not suppressed. Accordingly, the alloy layer 21 can be formed at the interface of the solder layer 20 with the circuit layer 12 and the coverage of the alloy layer 21 at the interface between the solder layer 20 and the circuit layer 12 can be set to 85% or more.

Second Embodiment

Next, a power module as a second embodiment of the present invention will be described with reference to attached drawings. In addition, the same members as those of the first embodiment will be given the same reference numerals, the explanation of which will be omitted here.

Figure 5:
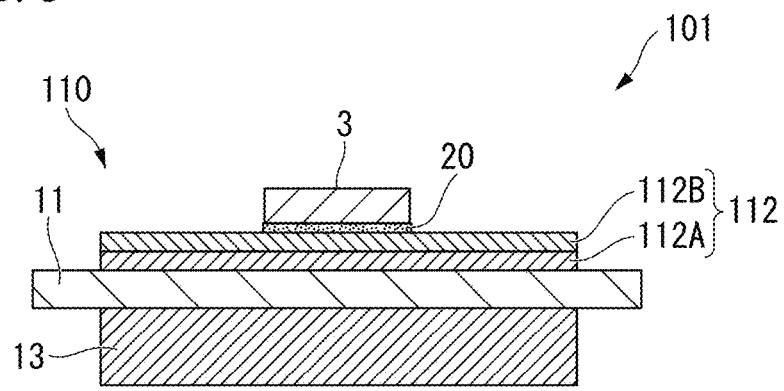
FIG. 5 is a schematic explanatory diagram of a power module as a second embodiment of the present invention.

In FIG. 5, a power module 101 of the second embodiment of the present invention is shown. The power module 101 includes a power module substrate 110 in which a circuit layer 112 is formed on one surface of an insulating substrate (insulating layer) 11, and a semiconductor element 3 that is mounted on the circuit layer 112 (the upper surface in FIG. 5).

The power module substrate 110 includes the insulating substrate 11 that forms the insulating layer, the circuit layer 112 that is arranged on one surface of the insulating substrate 11 (the upper surface in FIG. 5), and a metal layer 13 that is arranged on the other surface of the insulating substrate 11 (the lower surface in FIG. 5).

As shown in FIG. 5, the circuit layer 112 includes an aluminum layer 112A that is formed on one surface of the insulating substrate 11, and a copper layer 112B that is laminated on one surface of the aluminum layer 112A.

In the embodiment, the aluminum layer 112A is formed by bonding a rolled plate of aluminum having a purity of 99.99% by mass or more to the insulting substrate. In addition, the copper layer 112B is formed by bonding a copper sheet composed of a rolled plate of oxygen-free copper to one surface of the aluminum layer 112A by solid-phase diffusion.

One surface of the circuit layer 112 (upper surface in FIG. 5) is a surface to which the semiconductor element 3 is bonded. The thickness of the circuit layer 112 is preferably set to be within a range of, for example, 0.25 mm or more and 6.0 mm or less. In addition, the thickness of the aluminum layer 112A (aluminum sheet) is preferably set to be within a range of, for example, 0.2 mm or more and 3.0 mm or less and the thickness of the copper layer 112B is preferably set to be within a range of, for example, 50 μm or more and 3.0 mm or less.

Figure 6:
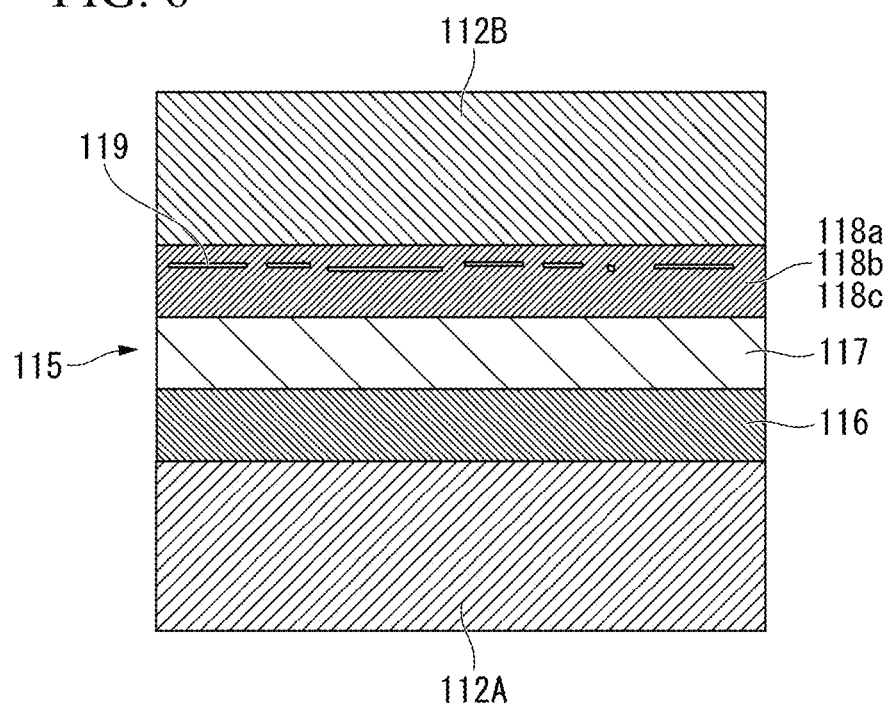
FIG. 6 is an enlarged explanatory diagram of a bonding interface between a copper layer and an aluminum layer in FIG. 5.

Here, as shown in FIG. 6, a diffusion layer 115 is formed at the interface between the aluminum layer 112A and the copper layer 112B.

The diffusion layer 115 is formed by mutual diffusion of Al atoms of the aluminum layer 112A and Cu atoms of the copper layer 112B. In the diffusion layer 115, a concentration gradient in which the aluminum atom concentration decreases gradually and the copper atom concentration increases from the aluminum layer 112A to the copper layer 112B is formed.

As shown in FIG. 6, the diffusion layer 115 is constituted of an intermetallic compound composed of Al and Cu and has a structure in which plural intermetallic compounds are laminated along the bonding interface in the embodiment. The thickness of the diffusion layer 115 is set to be within a range of 1 μm or more and 80 μm or less, and preferably within a range of 5 μm or more and 80 μm or less.

Figure 7:
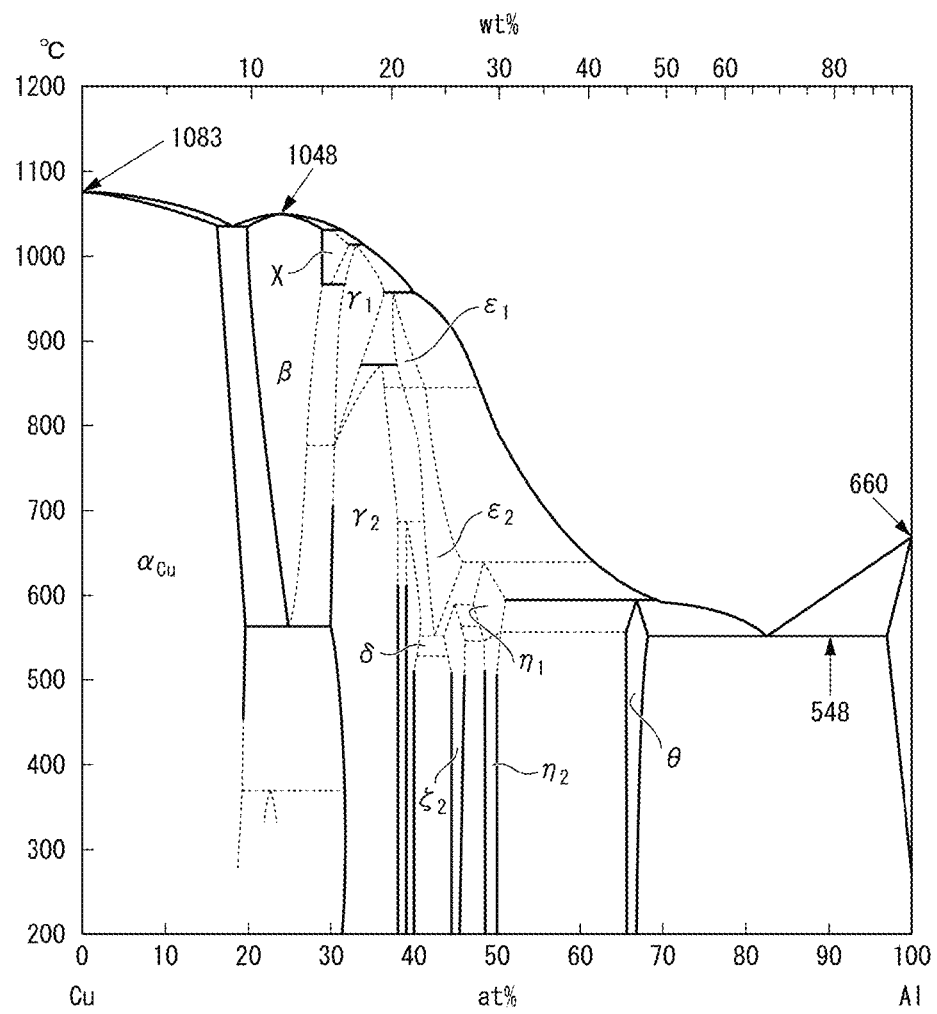
FIG. 7 is a binary phase diagram of Cu and Al.

In the embodiment, as shown in FIG. 6, a θ phase 116 and an $\eta_2$ phase 117 are laminated along the bonding interface between the aluminum layer 112A and the copper layer 112B sequentially from the aluminum layer 112A to the copper layer 112B, and further, at least one of a $\zeta_2$ phase 118a, a δ phase 118b, and a $\gamma_2$ phase 118c is laminated (refer to the phase diagram of FIG. 7).

Further, in the embodiment, along the interface between the copper layer 112B and the diffusion layer 115, an oxide 119 is dispersed in a laminated state in the layer composed of at least one of the $\zeta_2$ phase 118a, the δ phase 118b, and the $\gamma_2$ phase 118c. The oxide 119 is composed of an aluminum oxide such as alumina ($Al_2O_3$) or the like.

In the power module 101 of the embodiment, the circuit layer 112 (copper layer 112B) and the semiconductor element 3 are bonded by soldering and a solder layer 20 is formed between the circuit layer 112 (copper layer 112B) and the semiconductor element 3. In the embodiment, the thickness t1 of the solder layer 20 is set to be within a range of 50 μm or more and 200 μm or less.

The solder layer 20 is formed by using a Sn—Cu—Ni-based solder material as in the first embodiment and in this embodiment, a solder material of Sn-0.1% by mass to 4% by mass Cu-0.01% by mass to 1% by mass Ni is used.

Figure 8:
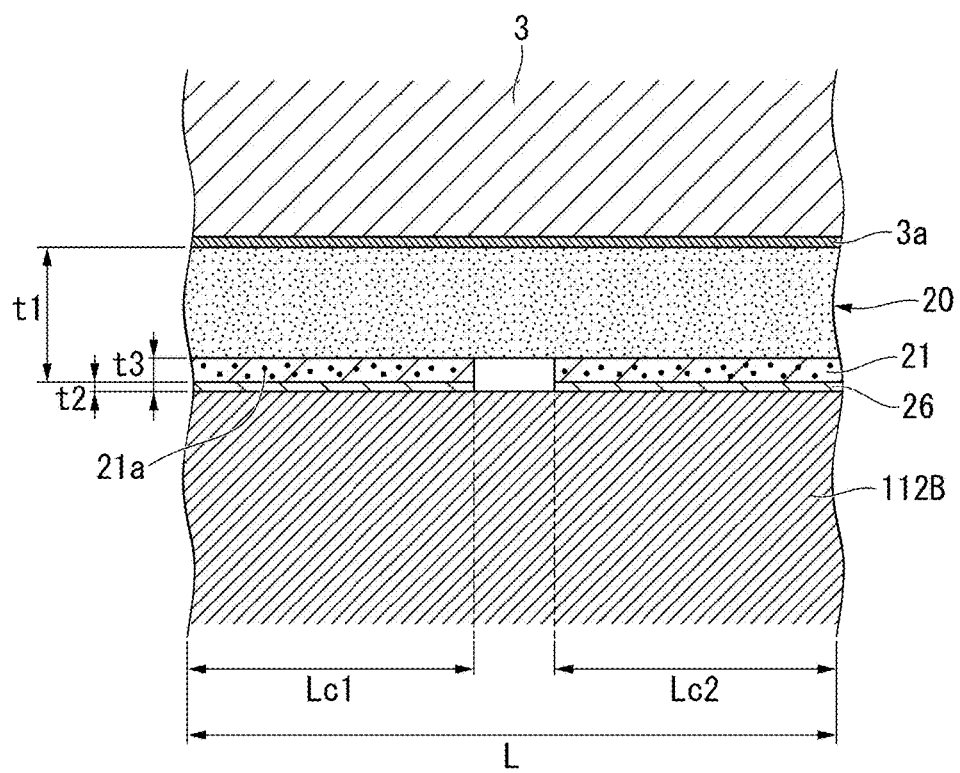
FIG. 8 is an enlarged explanatory diagram of a portion in which a circuit layer (copper layer) and a semiconductor element are bonded to each other in FIG. 5.

Here, as shown in FIG. 8, an intermetallic compound layer 26 is formed on the surface of the circuit layer 112 (copper layer 112B) and the solder layer 20 is arranged on the intermetallic compound layer 26. The intermetallic compound layer 26 is composed of an intermetallic compound ($Cu_3Sn$) of Cu and Sn. The thickness t2 of the intermetallic compound layer 26 is set to 0.8 μm or less.

An alloy layer 21 having a composition containing Sn as a main component, 0.5% by mass or more and 10% by mass or less of Ni, and 30% by mass or more and 40% by mass or less of Cu is formed at the interface of the solder layer 20 with the circuit layer 112 (copper layer 112B), and the thickness t3 of the alloy layer 21 is set to be within a range of 2 μm or more and 20 μm or less.

In the embodiment, the alloy layer 21 includes the intermetallic compound 21a composed of $(Cu, Ni)_6Sn_5$.

In the power module 101 of the embodiment, the coverage of the alloy layer 21 at the interface between the circuit layer 112 (copper layer 112B) and the solder layer 20 is set to 85% or more. In the embodiment, as shown in FIG. 8, the intermetallic compound layer 26 is not formed in a region in which the alloy layer 21 is not formed.

Here, as shown in FIG. 8, the coverage of the alloy layer 21 at the interface is a ratio $L_C/L$ of the length of the interface covered by the alloy layer 21 to the length L of the entire interface that is observed when the section of the circuit layer 112 (copper layer 112B) and the solder layer 20 is observed $L_C(=L_{C1}+L_{C2})$.

In addition, in the power module 101 of the embodiment, the thermal resistance increase rate when a power cycle is loaded 100,000 times under conditions of a conduction duration of 5 seconds and a temperature difference of 80° C. is less than 10% in a power cycle test.

Figure 9:
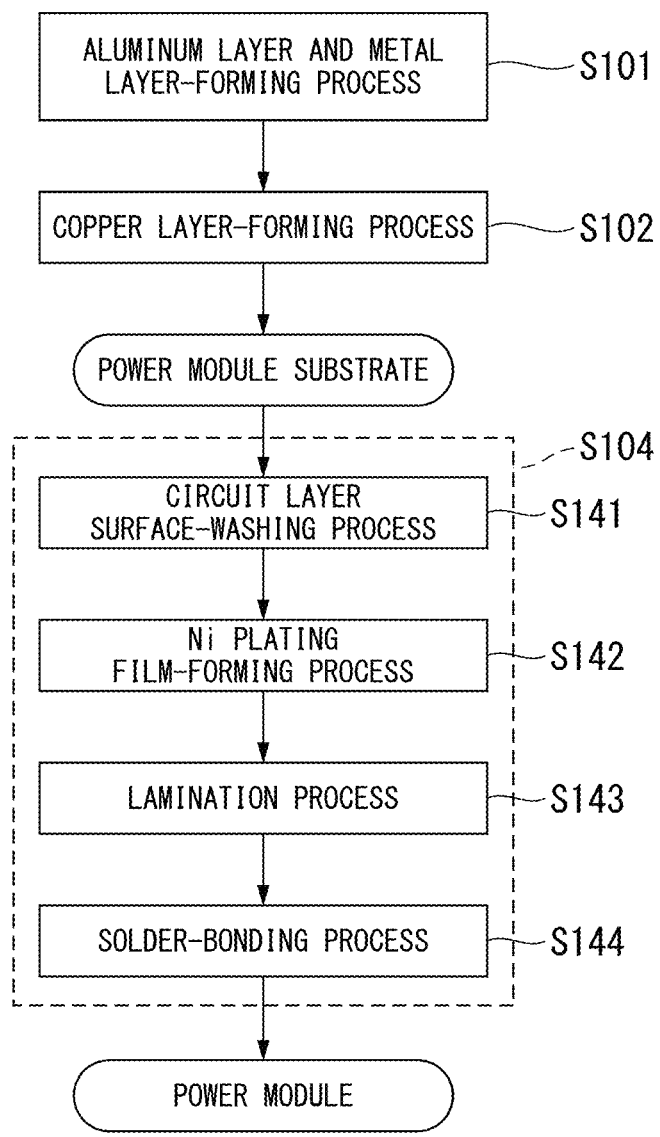
FIG. 9 is a flow diagram showing a method of producing the power module in FIG. 5.

Hereinafter, a method of producing the power module 101 of the embodiment will be described with reference to the flow diagram in FIG. 9.

First, aluminum sheets are bonded to one surface and the other surface of the insulating substrate 11 to form the aluminum layer 112A and a metal layer 13 (aluminum layer and metal layer-forming process S101).

The insulating substrate 11 and the aluminum sheet are laminated with a brazing material interposed therebetween and the insulating substrate 11 and the aluminum substrate are bonded by brazing. As the brazing material, for example, an Al—Si-based brazing material foil having a thickness of 20 μm to 110 μm can be used and the brazing temperature is preferably set to 600° C. to 620° C.

Next, a copper sheet is bonded to one surface of the aluminum layer 112A to form the copper layer 112B (copper layer-forming process S102).

A copper sheet is laminated on the aluminum layer 112A and the copper sheet and the aluminum layer are placed into a vacuum heating furnace and are heated therein in a state in which the copper sheet and the insulating substrate are compressed in a lamination direction (for example, at a pressure of 3 kgf/cm² or more and 35 kgf/cm² or less) to bond the aluminum layer 112A and the copper sheet by solid phase diffusion. In the copper layer-forming process S102, the heating temperature is set to, for example, 400° C. or higher and 548° C. or lower and the heating time is set to, for example, 15 minutes or more and 270 minutes or less. When the aluminum layer 112A and the copper sheet are bonded by solid phase diffusion, the heating temperature is preferably set to be within a range from a temperature 5° C. lower than the eutectic temperature (548.8° C.) of Al and Cu to a temperature lower than the eutectic temperature.

Through the copper layer-forming process S102, the circuit layer 112 including the aluminum layer 112A and the copper layer 112B is formed on one surface of the insulating substrate 11.

The semiconductor element 3 is bonded onto the circuit layer 112 (copper layer 112B) (semiconductor element-bonding process S104). As shown in FIG. 9, the semiconductor element-bonding process S104 has a circuit layer surface-washing process S141, a Ni plating film-forming process S142, a lamination process S143, and a solder-bonding process S144.

In the circuit layer surface-washing process S141, first, the surface of the circuit layer 112 (copper layer 112B) is subjected to alkaline washing. As a washing solution used in the alkaline washing, for example, a 5% by mass aqueous solution of sodium hydroxide and the like can be used. Then, the surface is rinsed with pure water and then washed with acid. As a washing solution used in the acid washing, a liquid mixture of hydrogen peroxide solution and sulfuric acid and the like can be used. Thereafter, the surface is rinsed with pure water.

Next, a thin Ni plating film having a thickness of about 0.2 μm is formed on the surface of the circuit layer 112 (copper layer 112B) (Ni plating film-forming process S142).

Then, the semiconductor element 3 is laminated on the Ni plating film with a solder material of Sn-0.1% by mass to 4% by mass Cu-0.01% by mass to 1% by mass Ni (lamination process S143) interposed therebetween.

In a state in which the semiconductor element 3 is laminated on the Ni plating film, the laminated body is placed into a reducing furnace, whereby the circuit layer 112 (copper layer 112B) and the semiconductor element 3 are bonded to each other (solder-bonding process S144). The atmosphere in the reducing furnace is set to a reducing atmosphere containing, for example, 1% by volume to 10% by volume of hydrogen, the heating temperature is set to, for example, 280° C. to 330° C., and the holding time is set to, for example, 0.5 minutes to 2 minutes. In addition, the average cooling rate to room temperature is set to be within a range of, for example, 2° C./s to 3° C./s.

As a result, the power module 101 of the embodiment can be produced by forming the solder layer 20 between the circuit layer 112 (copper layer 112B) and the semiconductor element 3.

Ni in the Ni plating film formed on the surface of the circuit layer 112 (copper layer 112B) diffuses into the solder material and thus the Ni plating film disappears.

In addition, Cu of the circuit layer 112 (copper layer 112B) diffuses into the solder material to form the alloy layer 21 at the interface of the solder layer 20 with the circuit layer 112 (copper layer 112B). Further, the alloy layer 21 has a composition containing Sn as a main component, 0.5% by mass or more and 10% by mass or less of Ni, and 30% by mass or more and 40% by mass or less of Cu.

The coverage of the alloy layer 21 at the interface between the circuit layer 112 (copper layer 112B) and the solder layer 20 is 85% or more.

In the power module 101 having the above-described configuration of the embodiment, the same effects as those of the first embodiment can be exhibited.

In addition, in the embodiment, since the circuit layer 112 has the copper layer 112B, heat generated from the semiconductor element 3 can be radiated by the copper layer 112*b* in the plane direction and thus the heat can be effectively transferred to the power module substrate 110.

Further, since the aluminum layer 112A having relatively low deformation resistance is formed on one surface of the insulating substrate 11, the thermal resistance generated during loading of a heat cycle can be absorbed by the aluminum layer 112A and thus breakage of the insulating substrate 11 can be suppressed.

In addition, since the copper layer 112B composed of copper or a copper alloy having relatively high deformation resistance is formed on one surface of the circuit layer 112, deformation of the circuit layer 112 during loading of a heat cycle can be suppressed and thus high reliability with respect to the power cycle can be obtained.

Further, since the aluminum layer 112A and the copper layer 112B are bonded by solid-phase diffusion and the temperature during the solid-phase diffusion bonding is set to 400° C. or higher in the embodiment, the diffusion of Al atoms and Cu atoms is promoted and the solid-phase diffusion can be sufficiently achieved in a short period of time. In addition, since the temperature during the solid-phase diffusion is set to 548° C. or lower, it is possible to suppress the formation of a bump at the bonding interface between the aluminum layer 112A and the copper layer 112B without the formation of a liquid phase of Al and Cu or to suppress a change in thickness.

Further, when the heating temperature of the above-described solid-phase diffusion bonding is set to be within a range from a temperature 5° C. lower than the eutectic temperature (548.8° C.) of Al and Cu to a temperature lower than the eutectic temperature, it is possible to suppress the formation of a compound of Al and Cu more than necessary. Also, the diffusion rate during solid-phase diffusion bonding is ensured and thus solid-phase diffusion bonding can be achieved in a relatively short period of time.

The embodiments of the present invention have been described above. However, the present invention is not limited thereto and may be appropriately modified without departing from the technical scope of the invention.

For example, the metal layer is composed of 4N aluminum having a purity of 99.99% by mass or more in the embodiment. However, there is no limitation thereto and the metal layer may be composed of other aluminum or aluminum alloys and may be composed of copper or a copper alloy.

In addition, for example, a rolled plate of oxygen-free copper is used as the metal plate serving as the circuit layer in the embodiment. However, there is no limitation thereto and the metal layer may be composed of other copper or copper alloys. Further, the surface of the circuit layer to be bonded to the semiconductor element may be composed of copper or a copper alloy.

Furthermore, an insulating substrate composed of AlN is used as the insulating layer. However, there is no limitation thereto and an insulating substrate composed of $Al_2O_3$, $Si_3N_4$, or the like may be used.

In addition, the insulating substrate and the copper sheet serving as the circuit layer are bonded by the active metal brazing method. However, there is no limitation thereto and the insulating substrate and the copper sheet may be bonded by a DBC method, a casting method, or the like.

Further, the insulating substrate and the aluminum sheet serving as the metal layer are bonded by brazing. However, there is no limitation thereto and a transient liquid phase bonding method, a metal paste method, a casting method, or the like may be applied.

In addition, the composition of the solder material is not limited to the embodiment and the composition of the solder layer formed after solder-bonding may contain Sn as a main component, 0.5% by mass or more and 10% by mass or less of Ni, and 30% by mass or more and 40% by mass or less of Cu.

Further, the heat sink shown in FIG. 1 is arranged. However, there is no limitation thereto and the heat sink may not be arranged and structures other than the structure shown in FIG. 1 (for example, a heat radiating plate, a heat radiating plate with a heat radiating fan, and the like) may be adopted.

In the second embodiment, a copper sheet is bonded to one surface of the aluminum layer by solid-phase diffusion to form a copper layer on the bonding surface of the circuit layer. However, there is no limitation thereto and the method of forming the copper layer is not limited.

For example, the copper layer may be formed on one surface of the aluminum layer by a plating method. In the case of forming a copper layer having a thickness of about 5 μm to 50 μm, it is preferable to use a plating method. In the case of forming a copper layer having a thickness of about 50 μm to 3 mm, it is preferable to use a solid-phase diffusion bonding.

Example 1

Hereinafter, the description will be made with respect to results of confirmation experiments that have been performed to confirm the effectiveness of the present invention with reference to Table 1.

The power module described in the aforementioned embodiment was prepared. As the insulating substrate, a substrate composed of AlN and having a size of 27 mm×17 mm and a thickness of 0.6 mm was used. In addition, as the circuit layer, a plate composed of oxygen-free copper and having a size of 25 mm×15 mm and a thickness of 0.3 mm was used. As the metal layer, a plate composed of 4N aluminum and having a size of 25 mm×15 mm and a thickness of 0.6 mm was used. As the semiconductor element, an IGBT element having a size of 13 mm×10 mm and a thickness of 0.25 mm was used. As the heat sink, an aluminum sheet (A6063) having a size of 40.0 mm 40.0 mm and a thickness of 2.5 mm was used.

In Examples 1 to 7 and Comparative Examples 2 to 5, the surface of the circuit layer was washed in the following manner. First, the surface of the circuit layer was subjected to alkaline washing. As an alkaline washing solution, a 5% by mass aqueous solution of sodium hydroxide was used. The surface of the circuit layer was rinsed with pure water and then the surface of the circuit layer was washed with acid. As an acid washing solution, a washing solution obtained by mixing 35% by mass of hydrogen peroxide solution, 98% by mass of sulfuric acid, and "ADDITIVE MGE-9" manufactured by C. Uyemura & Co., Ltd., as a stabilizer of an etching solution, at a volume ratio of 5:3:3 was used. Then, the surface of the circuit layer was rinsed with pure water.

In Comparative Example 1, the circuit layer was not washed.

In Example 7, a semiconductor element was bonded to the surface of the circuit layer by forming a Ni plating film using a solder material. The composition of the alloy layer after solder-bonding, the thickness of the alloy layer, and the like were adjusted by changing the composition of the solder material as shown in Table 1 to prepare various power modules of Examples 1 to 7 and Comparative Examples 1 to 5. In Examples 1 to 6 and Comparative Examples 1 to 5, a Ni plating film was not formed on the surface of the circuit layer.

The soldering conditions were set such that the soldering temperature and the soldering holding time were set to the conditions shown in Table 1, the atmosphere was a reducing atmosphere containing 3% volume of hydrogen, and the average cooling rate to room temperature was set to 2.5° C./s.

(Coverage)

In each of the power modules obtained as described above, the coverage of the alloy layer formed at the interface of the solder layer with the circuit layer was measured. The section of the semiconductor element and circuit layer was observed using a scanning electron microscope (QUANTA FEG 450, manufactured by FEI Company) and a ratio ($L_C/L$) of the length $L_C$ of the interface covered by the alloy layer to the length L of the observed entire interface was calculated. In the example, the ratio ($L_C/L$) of the length $L_C$ of the interface covered by the alloy layer to the total length L of the interfaces observed for each observation when observing sections of 10 visual fields in a visual field of 150 μm×100 μm was calculated. Then, the average value of the rates ($L_C/L$) calculated in each visual field was set as the coverage.

In the aforementioned sectional observation, as shown in FIG. 10, the element mapping of Ni and Cu was performed and a portion in which these elements were redundantly present was set as the alloy layer.

(Composition of Alloy Layer)

In addition, the components of the alloy layer formed at the interface of the solder layer with the circuit layer were analyzed by EPMA analysis. In the example, using an EPMA analyzer (JXA-8530F, manufactured by JEOL Ltd.), the average crystal grain size of the solder layer was analyzed in the condition in which the acceleration voltage was 15 kV, the spot diameter was 1 μm or less, and the magnification was 250 times.

(Thickness of Alloy Layer)

Further, the thickness of the alloy layer formed at the interface of the solder layer with the circuit layer was measured. EPMA mapping obtained using the aforementioned EPMA analyzer was obtained and the area of the alloy layer including a continuously formed intermetallic compound composed of $(Cu, Ni)_6Sn_5$ at the interface of the solder layer with the circuit layer was measured. Thus, the thickness of the alloy layer was obtained by dividing the area by the dimension of the mapping width. The area of the alloy layer was measured by excluding the region in which the intermetallic compound was not continuously formed from the interface with the circuit layer in the thickness direction from the alloy layer formed at the interface with the circuit layer. In addition, an intermetallic compound composed of $Cu_3Sn$ is very thin compared to the alloy layer. Thus, the thickness from the surface of the circuit layer was measured as the thickness of the alloy layer.

(Power Cycle Test)

The electric conduction to the IGBT element was controlled to repeat a cycle in which the temperature of the element surface when the current was applied (ON) reached 140° C. and the temperature of the element surface when the current was not applied (OFF) reached 60° C. at an interval of 10 seconds, and the power cycle was repeated 100,000 times. Then, the thermal resistance increase rate from the initial state was evaluated. In all of Examples 1 to 7, the thermal resistance increase rate when the power cycle is repeated 100,000 times is set to less than 10%.

(Power Cycle Life)

The electric conduction to the IGBT element was controlled to repeat a cycle in which the temperature of the element surface when the current was applied (ON) reached 140° C. and the temperature of the element surface when the current was not applied (OFF) reached 60° C. at an interval of 10 seconds, and the power cycle was repeated. Then, the number of power cycles when the increase rate of thermal resistance from the initial state reached 10% or more (power cycle life) was evaluated.

(Thermal Resistance Measurement)

As the thermal resistance, a transient thermal resistance was measured by using a thermal resistance tester (4324-KT, manufactured by TESEC Corporation). The thermal resistance was obtained by measuring a voltage difference between the gate and the emitter after power application while setting the application power to 100 W and the application time to 100 ms. The measurement was performed in every 10,000[th] cycle in the aforementioned power cycle test.

TABLE 1

| | | Composition of solder material (% by mass) | | | Circuit layer surface washing | Solder-bonding condition | | Thickness of Ni plating film (μm) | Composition of alloy layer (% by mass) | | | Coverage (%) | Thickness of alloy layer (μm) | Power cycle life* |
|---|---|---|---|---|---|---|---|---|---|---|---|---|---|---|
| | | Ni | Cu | Sn and inevitable impurities | | Temperature (°C.) | Time (min) | | Ni | Cu | Sn and inevitable impurities | | | |
| Example | 1 | 0.04 | 2.0 | Balance | Washed | 300 | 1.5 | 0 | 0.6 | 37.0 | Balance | 90 | 9 | 120,000 |
| | 2 | 0.26 | 0.4 | Balance | Washed | 300 | 0.5 | 0 | 9.8 | 31.2 | Balance | 95 | 3 | 110,000 |
| | 3 | 0.18 | 0.4 | Balance | Washed | 280 | 0.5 | 0 | 6.6 | 30.7 | Balance | 87 | 3 | 130,000 |
| | 4 | 0.10 | 3.6 | Balance | Washed | 300 | 1.5 | 0 | 0.9 | 38.5 | Balance | 93 | 15 | 140,000 |
| | 5 | 0.18 | 0.2 | Balance | Washed | 320 | 1 | 0 | 9.5 | 30.3 | Balance | 90 | 1.5 | 110,000 |
| | 6 | 0.10 | 4.7 | Balance | Washed | 300 | 13 | 0 | 0.6 | 38.2 | Balance | 96 | 22 | 110,000 |
| | 7 | 0.03 | 0.7 | Balance | Washed | 300 | 1 | 0.2 | 2.3 | 36.7 | Balance | 93 | 4 | 170,000 |
| Comparative Example | 1 | 0.04 | 2.0 | Balance | Not washed | 300 | 1.5 | 0 | 0.6 | 37.0 | Balance | 75 | 9 | 70,000 |
| | 2 | 0.00 | 1.0 | Balance | Washed | 300 | 1 | 0 | 0.0 | 39.0 | Balance | 87 | 5 | 70,000 |
| | 3 | 0.50 | 0.7 | Balance | Washed | 300 | 0.5 | 0 | 15.0 | 35.0 | Balance | 95 | 4 | 80,000 |
| | 4 | 0.18 | 0.2 | Balance | Washed | 280 | 0.1 | 0 | 9.0 | 24.0 | Balance | 86 | 0.5 | 80,000 |
| | 5 | 0.09 | 5.7 | Balance | Washed | 350 | 5 | 0 | 0.7 | 50.0 | Balance | 95 | 24 | 80,000 |

*Power cycle life: Number of cycles when the thermal resistance was increased by 10%.

In Comparative Example 1 in which the surface of the circuit layer was not washed, the coverage of the alloy layer was less than 85% and the power cycle life was short as 70,000 times. It is assumed that this is because cracks develop at the interface between the solder layer and the circuit layer and breakage of solder occurs in the early stage using these cracks as starting points.

In addition, in Comparative Examples 2 and 3 in which the Ni content was out of the range of the present invention, the power cycle lives were short as 70,000 times and 80,000 times. It is assumed that this is because the alloy layer is thermally unstable.

Further, in Comparative Example 4 in which the Cu content was less than 30% by mass, the power cycle life was short as 80,000 times. It is assumed that this is because the alloy layer is thermally unstable due to Cu deficiency in the alloy layer and thus cracks are initiated.

In Comparative Example 5 in which the Cu content was more than 40% by mass, the power cycle life was short as 80,000 times. It is assumed that this is because the thickness of the alloy layer is thick and cracks are initiated.

Contrarily, in Examples 1 to 7, the composition of the alloy layer was within the range of the present invention, the coverage of the alloy layer was 85% or more, and the power cycle life was 110,000 times or more. It is assumed that this is because cracks at the interface between the circuit layer and the solder layer are suppressed by the alloy layer and breakage of the solder layer using these cracks as starting points is suppressed.

As described above, according to the present invention, it was confirmed that a power module having excellent power cycle properties could be obtained.

Example 2

Next, the power module having a circuit layer composed of an aluminum layer and a copper layer as described in the second embodiment was prepared.

As the insulating substrate, a substrate composed of AlN having a size of 27 mm×17 mm and a thickness of 0.6 mm was used. In addition, as the metal layer, a plate composed of 4N aluminum and having a size of 25 mm×15 mm and a thickness of 0.6 mm was used. As the semiconductor element, an IGBT element having a size of 13 mm×10 mm and a thickness of 0.25 mm was used. As the heat sink, an aluminum sheet (A6063) having a size of 40.0 mm×40.0 mm and a thickness of 2.5 mm was used.

As the aluminum layer in the circuit layer, an aluminum layer composed of 4N aluminum and having a size of 25 mm×15 mm and a thickness of 0.6 mm was used. The copper layer was formed by plating or solid-phase diffusion bonding as shown in Table 2.

In a case of using plating, the surface of the aluminum layer was subjected to zincate treatment and then a copper layer having the thickness shown in Table 2 was formed by electrolytic plating.

In a case of using solid-phase diffusion bonding, a copper sheet having the thickness shown in Table 2 was prepared and the copper sheet was bonded to the surface of the aluminum layer by solid-phase diffusion under the conditions shown in the second embodiment as an example.

Next, the surface of the circuit layer (copper layer) was washed in the same manner as in Example 1.

The IGBT element was bonded onto the surface of the circuit layer (copper layer) by soldering. The soldering conditions were set such that the soldering temperature and the soldering holding time were set to the conditions shown in Table 2, the atmosphere was a reducing atmosphere containing 3% volume of hydrogen, and the average cooling rate to room temperature was set to 2.5° C./s. As the solder material, a material having a composition including 0.08% by mass of Ni, 1.0% by mass of Cu, and a balance consisting of Sn and inevitable impurities was used.

As described above, various power modules of Examples 11 to 16 were prepared.

Then, the composition of the alloy layer, the coverage, the thickness of the alloy layer, and the power cycle life were evaluated in the same manner as in Example 1. The evaluation results are shown in Table 2.

TABLE 2

| | | Composition of solder material (% by mass) | | | Thickness of copper layer (mm) | Formation method of copper layer | Soldering temperature (° C.) | Soldering retaining time (minute) | Composition of alloy layer (% by mass) | | | Coverage (%) | Thickness of alloy layer (μm) | Power cycle life* |
|---|---|---|---|---|---|---|---|---|---|---|---|---|---|---|
| | | Ni | Cu | Sn and inevitable impurities | | | | | Ni | Cu | Sn and inevitable impurities | | | |
| Example | 11 | 0.08 | 1.0 | Balance | 0.005 | Plating | 300 | 1 | 1.9 | 36.3 | Balance | 90 | 4 | 120000 |
| | 12 | 0.08 | 1.0 | Balance | 0.01 | Plating | 300 | 1 | 2.1 | 36.9 | Balance | 92 | 3 | 130000 |
| | 13 | 0.08 | 1.0 | Balance | 0.03 | Plating | 300 | 1 | 1.9 | 36.5 | Balance | 94 | 4 | 160000 |
| | 14 | 0.08 | 1.0 | Balance | 0.05 | Solid-phase diffusion | 300 | 1 | 2.0 | 36.4 | Balance | 93 | 4 | 150000 |
| | 15 | 0.08 | 1.0 | Balance | 0.3 | Solid-phase diffusion | 300 | 1 | 1.9 | 36.7 | Balance | 94 | 5 | 180000 |
| | 16 | 0.08 | 1.0 | Balance | 3 | Solid-phase diffusion | 300 | 1 | 1.9 | 36.8 | Balance | 93 | 6 | 110000 |

*Power cycle life: Number of cycles when the thermal resistance reached 10% or more.

As shown in Table 2, in all of Examples 11 to 16, it was confirmed that the power cycle life is 110,000 times or more and breakage of the solder layer is suppressed. Even in a case in which the circuit layer is formed by forming copper layers having different thicknesses on the aluminum layer, as in Example 1, it was confirmed that the power cycle properties could be improved.

In addition, when the thickness of the copper layer was 5 μm or more, it was confirmed that all the Cu in the copper layer did not diffuse to the solder and the copper layer remained. Further, when the thickness of the copper layer was 3 mm or less, it was confirmed that the power cycle life was 100,000 times or more.

INDUSTRIAL APPLICABILITY

According to the present invention, it is possible to provide a power module capable of suppressing the occurrence of breakage of a solder layer at an early stage even when a power cycle is loaded and having high reliability. Accordingly, the present invention is industrially applicable.

REFERENCE SIGNS LIST

1: Power module
3: Semiconductor element
10: Power module substrate
11: Insulating substrate (Insulating layer)
12: Circuit layer
13: Metal layer
20: Solder layer
21: Alloy layer
21a: Intermetallic compound
26: Intermetallic compound layer
30: Solder material
31: Ni plating film
101: Power module
112: Circuit layer
112A: Aluminum layer
112B: Copper layer

The invention claimed is:

1. A power module, comprising:
a power module substrate in which a circuit layer is arranged on one surface of an insulating layer; and
a semiconductor element that is bonded onto the circuit layer,
wherein a copper layer composed of copper or a copper alloy is provided on a surface of the circuit layer to be bonded to the semiconductor element,
a solder layer composed of a solder material between the circuit layer and the semiconductor element is provided,
an alloy layer containing Sn as a main component, 0.5% by mass or more and 10% by mass or less of Ni, and 30% by mass or more and 40% by mass or less of Cu at an interface of the solder layer with the circuit layer is formed,
the coverage of the alloy layer at the interface is 85% or more and 96% or less,
the interface between the solder layer and the circuit layer is free of a Ni plating film,
the coverage of the alloy layer at the interface is the average value of a ratio (LC/L) calculated for each cross-section observation, by performing a plurality of times of cross-sectional observation of the solder layer and the circuit layer by an electron microscope, and
the ratio (LC/L) is a ratio of the length LC of the interface covered by the alloy layer to the total length L of the interfaces observed in each cross-section observation.

2. The power module according to claim 1,
wherein a thermal resistance increase rate when a power cycle is loaded 100,000 times under conditions of a conduction duration of 5 seconds and a temperature difference of 80° C. is less than 10% in a power cycle test.

3. The power module according to claim 2,
wherein a thickness of the alloy layer is within a range of 2 μm or more and 20 μm or less.

4. The power module according to claim 3,
wherein the alloy layer includes an intermetallic compound composed of $(Cu, Ni)_6Sn_5$.

5. The power module according to claim 2,
wherein the alloy layer includes an intermetallic compound composed of $(Cu, Ni)_6Sn_5$.

6. The power module according to claim 1,
wherein a thickness of the alloy layer is within a range of 2 μm or more and 20 μm or less.

7. The power module according to claim 6,
wherein the alloy layer includes an intermetallic compound composed of $(Cu, Ni)_6Sn_5$.

8. The power module according to claim 1,
wherein the alloy layer includes an intermetallic compound composed of $(Cu, Ni)_6Sn_5$.

9. The power module according to claim 8, further comprising,
an intermetallic compound layer composed of $Cu_3Sn$ and provided between the alloy layer and the circuit layer is provided.

10. The power module according to claim 9,
wherein the intermetallic compound layer is not formed in a region where the alloy layer is not formed.

11. The power module according to claim 9,
wherein the intermetallic compound layer is thinner than the alloy layer.

12. The power module according to claim 10,
wherein the intermetallic compound layer is thinner than the alloy layer.

13. The power module according to claim 1, further comprising,
an intermetallic compound layer composed of $Cu_3Sn$ and provided between the alloy layer and the circuit layer is provided.

14. The power module according to claim 13,
wherein the intermetallic compound layer is not formed in a region where the alloy layer is not formed.

15. The power module according to claim 13,
wherein the intermetallic compound layer is thinner than the alloy layer.

16. The power module according to claim 14,
wherein the intermetallic compound layer is thinner than the alloy layer.

17. The power module according to claim 1,
wherein a thickness of the copper layer is within a range of 5 μm or more and 3 mm or less.

* * * * *